United States Patent [19]

Deutsch et al.

[11] Patent Number: 5,006,918
[45] Date of Patent: Apr. 9, 1991

[54] FLOATING ORTHOGONAL LINE STRUCTURE FOR X-Y WIRING PLANES

[75] Inventors: Alina Deutsch, Mount Kisco; Barry J. Rubin, Croton-on-Hudson, both of N.Y.

[73] Assignee: International Business Machines Corporation, Armonk, N.Y.

[21] Appl. No.: 383,516

[22] Filed: Jul. 24, 1989

[51] Int. Cl.$^5$ ................ H01L 23/48; H01L 29/46; H01L 29/54
[52] U.S. Cl. ........................ 357/71; 357/40; 357/51
[58] Field of Search ........... 357/71, 51, 68, 40, 357/41, 45

[56] References Cited

U.S. PATENT DOCUMENTS

| | | | |
|---|---|---|---|
| 3,904,886 | 9/1975 | Ehling et al. | 307/89 |
| 4,212,026 | 7/1980 | Balasubramanian et al. | 357/68 |
| 4,423,432 | 12/1983 | Stewart et al. | 357/41 |
| 4,583,111 | 4/1986 | Early | 357/68 |
| 4,589,008 | 5/1986 | Stewart et al. | 357/68 |
| 4,656,370 | 4/1987 | Kanuma | 307/303 |
| 4,770,921 | 9/1988 | Wacker et al. | 428/209 |
| 4,825,280 | 4/1989 | Chen et al. | 357/71 |
| 4,845,538 | 7/1989 | Hazani | 357/45 |

OTHER PUBLICATIONS

IBM Technical Disclosure Bulletin, vol. 28, No. 10, Mar. 1986, p. 4618, Reduced Coupled Noise Technique for Engineering Changes.
IBM Technical Disclosure Bulletin, vol. 17, No. 5, Oct. 1974, p. 135, FET Stray and Coupling Capacitance Equalization Technique, G. Sonoda.
IBM Technical Disclosure Bulletin, vol. 27, No. 11, Apr. 1985, p. 6578, Programmable Line Width and Ground Plane for Thin Film Module Package.

*Primary Examiner*—Rolf Hille
*Assistant Examiner*—Hoanganh Le
*Attorney, Agent, or Firm*—John J. Goodwin

[57] ABSTRACT

Far-end noise caused by coupling between active and quiet signal lines of wiring planes of an integrated circuit chip or chip carrier is reduced by providing floating crossing lines in wiring layers in an X-Y wiring plane pair.

1 Claim, 1 Drawing Sheet

FLOATING ORTHOGONAL LINE STRUCTURE FOR X-Y WIRING PLANES

BACKGROUND OF THE INVENTION

1. Field of the Invention

The present invention is directed to integrated circuit chips or chip carriers, such as modules or boards, containing X-Y wiring planes, and more particularly to a wiring arrangement for such carriers including orthogonal lines in the wiring pair for noise suppression.

2. Description of Related Art

U.S. Pat. No. 4,583,111 issued Apr. 15, 1986 to Early, entitled INTEGRATED CIRCUIT CHIP WIRING ARRANGEMENT PROVIDING REDUCED CIRCUIT INDUCTANCE AND CONTROLLED VOLTAGE GRADIENTS, discloses an integrated circuit chip wiring arrangement which provides reduced circuit inductance and controlled voltage gradients. Bonding pads are connected to logic gates which are physically adjacent to one another and power and ground busses are adjacent to one another relative to the logic gates.

More particularly, the area circumscribed by the current path on an integrated circuit chip is diminished, to thereby reduce the inductance of the chip and the likelihood of inductively generated errors, by disposing the bonding pads, through which the current source and current sink are respectively connected to logic gates, physically adjacent to one another. A further reduction in the area of the current loop is obtained by locating power and ground busses adjacent to one another relative to the logic gates. These two busses can be superposed one over the other on different metallic layers of the chip, so that the space between them is only the thickness of the isolation layer which separates the two metallic layers. The distribution of voltage to the logic gates is made uniform by varying the widths of the busses along their lengths in accordance with the currents they carry, and by ensuring that the total length of the current path for the gates is the same for every gate.

U.S. Pat. No. 3,904,886, issued Sept. 9, 1975 to Ehling et al, entitled VOLTAGE DISTRIBUTION SYSTEMS FOR INTEGRATED CIRCUITS, discloses a technique for damping unwanted noise by locating diffusion loops under voltage lines. More particularly, a technique is disclosed for damping unwanted power system oscillations present in an integrated circuit package. A very low d.c. impedance is achieved at any point in the voltage distribution system by a reduction in inductance, and increase in capacitance and an increase in a.c. resistance. The resistive voltage drop is achieved only at higher frequencies near the resonance frequency of the oscillations where it is needed. The scheme can be implemented on an integrated circuit chip by locating highly doped closed diffusion loops under the voltage supply lines or by placing metal layers on top of it. Further, a highly doped substrate has the same effect.

In U.S. Pat. No. 4,656,370, issued Apr. 7, 1987 to Kanuma entitled INTEGRATED CIRCUIT WITH DIVIDED POWER SUPPLY WIRING, an integrated circuit (IC) is provided with a plural set of power supply and ground lines within a package of the IC. Circuit elements, e.g., output buffers in the IC are divided into plural groups and each buffer group is coupled to the corresponding set of power supply and ground lines. Each set of the power supply and ground lines is provided with independent wirings so that the magnitude of current change in each wiring and the value of each wiring inductance become small.

U.S. Pat. No. 4,770,921, issued Sept. 13, 1988 to Wacker et al entitled SELF-SHIELDING MULTI-LAYER CIRCUIT BOARDS, discloses self-shielding multi-layer circuit boards which are produced utilizing augmentative replacement techniques.

Other wiring configurations are described in IBM Technical Disclosure Bulletin Publications, Vol. 28, No. 10, March 1986 at page 4618; Vol. 17, No. 5, October 1974 at page 135 and Vol. 27, No. 11, April 1985 at page 6578.

SUMMARY OF THE INVENTION

An object of the present invention is to provide means for reducing far-end noise occurring on wiring pairs in X-Y wiring planes of an integrated circuit chip or chip carrier through the use of short, floating crossing lines in wiring layers in an X-Y wiring plane pair. Another object is to use such short, floating lines to reduce impedance.

DESCRIPTION OF THE PREFERRED EMBODIMENT

In high-performance integrated circuit packages, an X-Y plane pair of wiring is placed between reference planes. Capacitive and inductive coupling between active and quiet signal lines, however, causes unwanted coupled noise.

The noise at the same end as the disturbance causing it, referred to in the art as the near-end noise, is proportional to the sum of the capacitive and inductive coupling coefficients. The noise at the opposite end, referred to as the far-end noise, is proportional to their difference. Though near-end noise saturates after a coupled length determined by the signal risetime, over lengths typically found in packages, the far-end noise increases linearly with length and inversely with signal risetime. At signal transition speed of one nanosecond, for example, near-end exceeds far-end noise and is a constraining factor in wiring a carrier. With typical signal transition speeds being reduced to values of 0.2 nanosecond, however, the far-end noise may increase five fold to become the dominate factor and present wiring constraints that are unacceptable.

Figure 2:
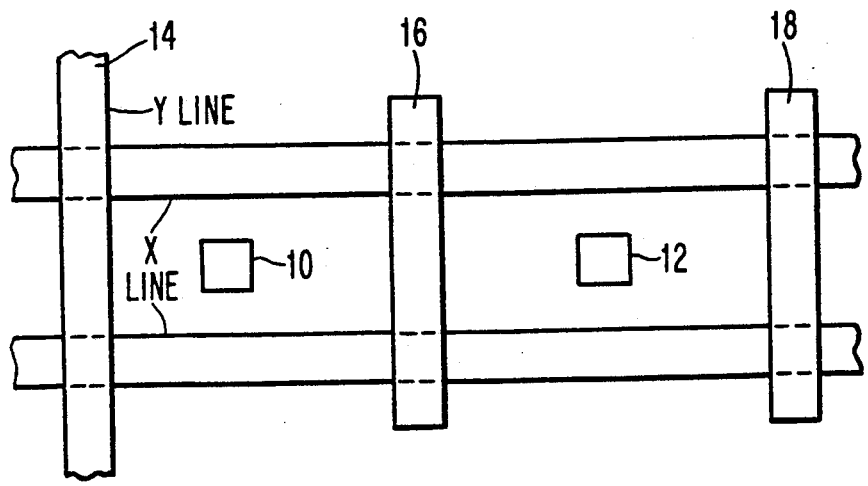
FIG. 2 is a schematic illustration of an embodiment of a wiring pair including floating, crossing lines according to the present invention.
Figure 3:
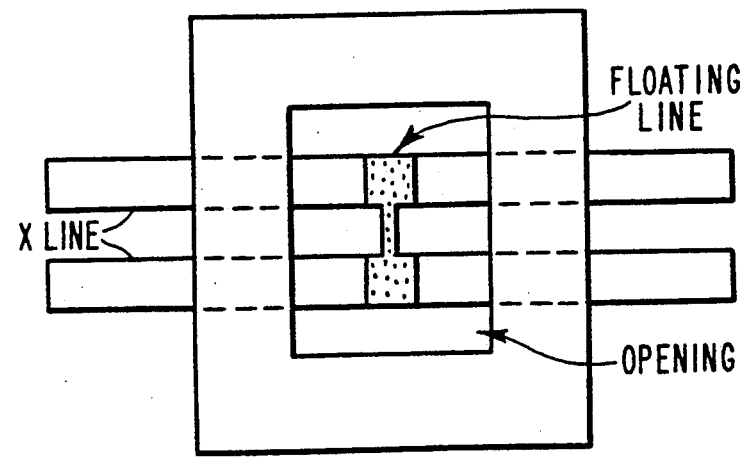
FIG. 3 is a schematic illustration of another embodiment of a wiring pair containing floating lines for reducing far-end noise according to the principles of the present invention.

This invention, illustrated in FIGS. 2 and 3, is a technique to reduce far-end noise that requires no package design changes, except for the inclusion of floating lines at otherwise empty positions. Such floating lines could also be used to decrease impedance in such carriers where process conditions have led to greater than desirable impedance.

The invention is based on the concept that far-end noise would be negligible in a package devoid of crossing lines and adjacent vias, because capacitive and inductive coupling are nearly equal. Other lines and vias, however, shield adjacent lines and reduce coupling.

Inductive coupling between adjacent lines decreases only marginally, since other lines and vias constitute perpendicular elements that shield only through eddy current. Capacitive coupling, however, decreases substantially because such other lines and vias effectively block electric field. Though near-end noise benefits from reductions in either type of coupling, far-end noise increases considerably when other lines and vias are introduced. When the capacitive coupling is increased just enough to make it equal to the inductive coupling, the far-end noise is nearly eliminated. Near-end noise would increase, but still be less than that when no other lines or vias are present.

Long crossing lines, having sufficient capacitance to be considered as shorted to the nearest reference plane, capacitively shield adjacent signal lines. Short crossing lines left floating, however, having small capacitance, act as conduits to increase capacitive coupling. Consider the coupled x-lines in FIG. 1, where capacitances are in picofarads per signal line pitch (10 lines/cm yield a 0.1 cm pitch).

Figure 1:
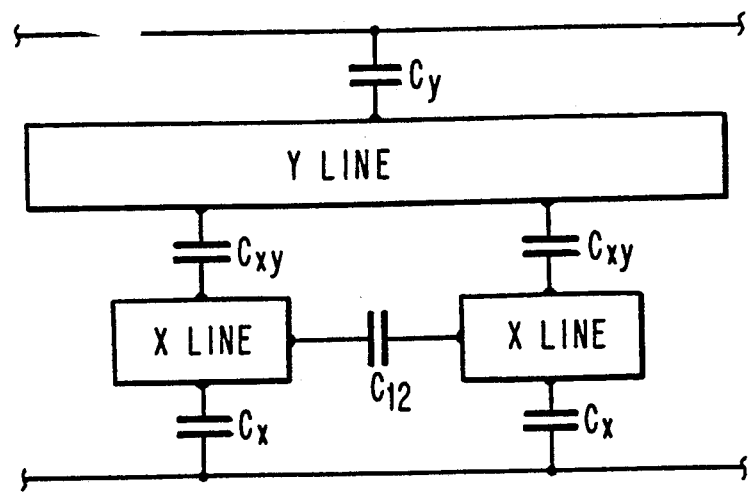
FIG. 1 is a schematic illustration of a capacitance model for coupled signal lines useful in describing the present invention.

In FIG. 1, $C_x$ is defined as the x-line's capacitance to the reference planes, $C_{xy}$ is defined as the overlap capacitance between crossing lines and $C_{12}$ is defined as the coupling capacitance between two parallel lines. The Y-line floats and has the length of two signal line pitches so its capacitance to the reference planes, ignoring end effects, is only $C_y = 2C_x$.

The X-line's even mode capacitance is $C_x + C_{xy}C_x/(C_{xy}+C_x)$, obtained by applying even symmetry about the vertical plane bisecting the structure, while the odd mode capacitance is $C_x + C_{xy} + 2C_{12}$, obtained by bisecting the structure with a perfectly conducting plane. The new coupling capacitance is simply half their difference, $C_{12} + \frac{1}{2}[C_{xy} - C_{xy}C_x/(C_{xy}+C_x)]$, with the increase given by $\frac{1}{2}[C_{xy} - C_{xy}C_x/(C_{xy}+C_x)]$. When such floating lines are added at every possible position, then the above capacitances may be replaced by their per cm values. A typical structure might have $C_x = 1.2$ pf/cm, $C_{xy} = 0.6$ pf/cm, and $C_{12} = 0.1$ pf/cm, so that the coupling capacitance would increase from 0.1 pf/cm to 0.2 pf/cm. Floating line introduced at half the possible positions would give half the above increase.

It is known from wiring studies that only about half a package's wiring capacity can be practically utilized. With half the wiring sites empty, short crossing lines can easily be fitted after normal wiring routing, either precisely or randomly, for example at twenty-five percent of the available sites. If placed randomly, statistical analysis would provide the probability such short lines would actually overlap two adjacent lines, and the number of floating lines required to increase the capacitive coupling just enough to eliminate the far-end noise would be simply calculated.

Thus, the structure of the present invention provides for short crossing lines added to wiring pairs to eliminate the far-end noise. FIG. 2 shows a simple embodiment of the invention. The vias 10 and 12 and a long Y-line 14 represent other lines and vias that cause the difference between capacitive and inductive coupling, while the added floating lines 16 and 18 represent the invention. Another embodiment of the invention that enhances the floating line's effect is shown in FIG. 3 where the floating line has a configuration or shape to increase the value of $C_{xy}$ and the nearest reference plane is opened to reduce $C_y$. Another way to increase capacitive coupling would be to place short, floating vias at otherwise empty sites, with the via having an H shaped cross section to minimize eddy current and thus inductive effects.

In summary, the present invention is a structure that includes a plane pair of wiring, such as a multi-chip carrier, with floating lines to decrease far-end noise and to reduce impedance mismatch between different package levels.

Having thus described our invention, what we claim as new, and desire to secure by Letters Patent are:

1. In an integrated circuit structure of the type having printed circuit wiring lines disposed on integrated circuit chips, a wiring configuration for reducing noise in the integrated circuit comprising:

at least one pair of parallel, adjacent, electrically conductive integrated circuit X-lines disposed on an integrated circuit chip said parallel adjacent electrically conductive integrated circuit lines being separated by a pitch distance d and being capacitively coupled and inductively coupled to each other wherein the difference between said capacitively and inductively coupled conductive lines produce a far end noise factor, at least one additional integrated circuit conductive Y-line disposed orthogonally across said at least one pair of parallel electrically conductive X-lines, said at least one additional conductive X-lines functioning to reduce said capacitive and inductive coupling of said parallel adjacent conductive X-lines wherein the amount of said capacitive coupling reduction is relatively greater than the amount of said inductive coupling reduction, thereby increasing the far-end noise factor of said parallel adjacent conduction X-lines, and at least one non-grounded conductive line of length 2d disposed orthogonally across and capacitively coupled to said at least one pair of parallel adjacent conductive X-lines for increasing the amount of said capacitive coupling of said parallel adjacent conductive X-lines to reduce the amount of said far-end noise factor, a second integrated circuit chip disposed above said pair of parallel, adjacent, electrically conductive integrated circuit lines, said integrated circuit chip and said second integrated circuit chip being reference planes, wherein said X-lines provide a capacitance relative to said reference planes designated $C_x$, wherein said Y-line disposed orthogonally across said at least one pair of X-lines provides an overlap capacitance of $C_{xy}$, wherein $C_{12}$ is the coupling capacitance between said parallel X-lines, and the capacitance of said non-grounded orthogonally disposed line relative to said reference planes in $C_y = 2C_x$ and, wherein said $C_{12}$ coupling capacitance between said parallel X-lines is increased in value to an amount $C_{12} + \frac{1}{2}$ by said non-grounded orthogonally disposed line.

* * * * *